United States Patent
Jeong (12)

(10) Patent No.: US 10,020,074 B1
(45) Date of Patent: Jul. 10, 2018

(54) NONVOLATILE STORAGE CIRCUIT AND SEMICONDUCTOR MEMORY DEVICE INCLUDING THE SAME

(71) Applicant: SK hynix Inc., Gyeonggi-do (KR)

(72) Inventor: Se-Ra Jeong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/653,151

(22) Filed: Jul. 18, 2017

(30) Foreign Application Priority Data

Jan. 12, 2017 (KR) ........................ 10-2017-0005026

(51) Int. Cl.
*G11C 29/00* (2006.01)

(52) U.S. Cl.
CPC ............ *G11C 29/785* (2013.01); *G11C 29/70* (2013.01); *G11C 29/72* (2013.01); *G11C 29/78* (2013.01); *G11C 29/787* (2013.01)

(58) Field of Classification Search
CPC ......... G11C 29/70; G11C 29/72; G11C 29/78; G11C 29/785; G11C 29/787
See application file for complete search history.

(56) References Cited

U.S. PATENT DOCUMENTS

| | | | | |
|---|---|---|---|---|
| 6,603,689 B2* | 8/2003 | Kato | .................... | G11C 29/787 365/200 |
| 6,714,466 B2* | 3/2004 | Park | ...................... | G11C 29/44 365/189.02 |
| 7,656,220 B2* | 2/2010 | Kawamata | .......... | G11C 29/785 327/525 |

FOREIGN PATENT DOCUMENTS

| KR | 1020150072043 | 6/2015 |
|---|---|---|
| KR | 1020160106319 | 9/2016 |

\* cited by examiner

*Primary Examiner* — Vanthu Nguyen
(74) *Attorney, Agent, or Firm* — IP & T Group LLP

(57) ABSTRACT

A nonvolatile storage circuit may include a nonvolatile storage unit configured to include fuse set groups respectively including a plurality of fuse sets and a flag fuse; a rupture control unit configured to program an input address to the fuse sets in a first program mode, and to program a same input address to a specific fuse set among the plurality of fuse sets in a specific fuse set group among the fuse set groups and to program the flag fuse of the specific fuse set group in a second program mode; and a boot-up control unit configured to control the address programmed in the fuse sets to be outputted as fuse data, and to control the address programmed in the specific fuse set to be outputted as fuse data of remaining fuse sets among the plurality of fuse sets in the specific fuse set group.

20 Claims, 12 Drawing Sheets

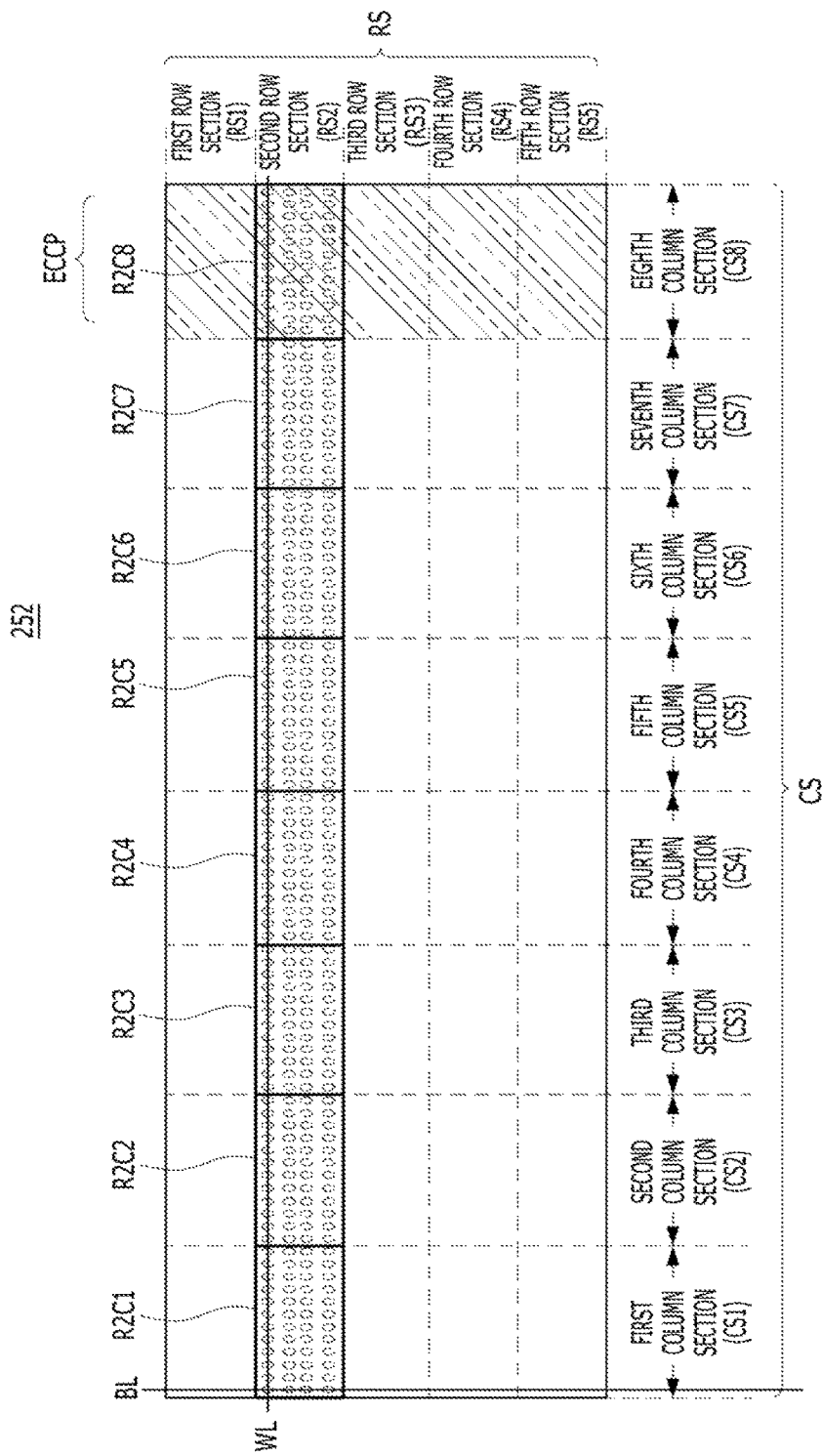

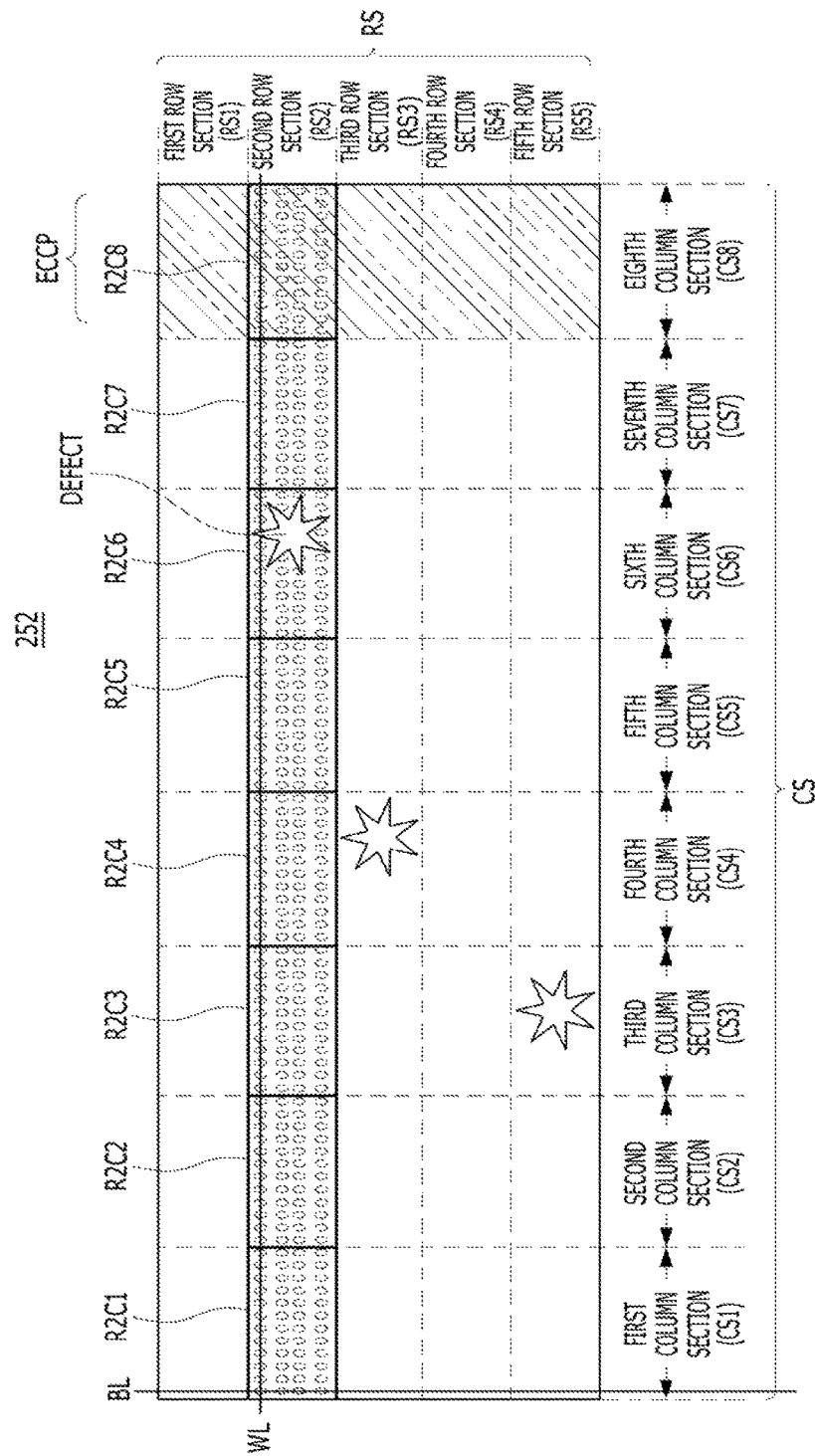

FIG. 8A

| | | Z2 | |
|---|---|---|---|
| A0021 | NO PROGRAM | 0 | FS2_1 |
| A0022 | NO PROGRAM | | FS2_2 |
| A0023 | NO PROGRAM | | FS2_3 |
| A0024 | NO PROGRAM | | FS2_4 |
| A0025 | NO PROGRAM | | FS2_5 |
| A0026 | ADDR1 | | FS2_6 |
| A0027 | NO PROGRAM | | FS2_7 |
| A0028 | NO PROGRAM | | FS2_8 |

FS_GRP2

| | | Z3 | |
|---|---|---|---|
| A0031 | NO PROGRAM | 0 | FS3_1 |
| A0032 | NO PROGRAM | | FS3_2 |
| A0033 | NO PROGRAM | | FS3_3 |
| A0034 | ADDR2 | | FS3_4 |
| A0035 | NO PROGRAM | | FS3_5 |
| A0036 | NO PROGRAM | | FS3_6 |
| A0037 | NO PROGRAM | | FS3_7 |
| A0038 | NO PROGRAM | | FS3_8 |

FS_GRP3

| | | Z5 | |
|---|---|---|---|
| A0051 | NO PROGRAM | 0 | FS5_1 |
| A0052 | NO PROGRAM | | FS5_2 |
| A0053 | ADDR3 | | FS5_3 |
| A0054 | NO PROGRAM | | FS5_4 |
| A0055 | NO PROGRAM | | FS5_5 |
| A0056 | NO PROGRAM | | FS5_6 |
| A0057 | NO PROGRAM | | FS5_7 |
| A0058 | NO PROGRAM | | FS5_8 |

FS_GRP5

FIG. 8B

| | | | |
|---|---|---|---|
| | A0021 | ADDR1 | Z2 1 | FS2_1 |
| | A0022 | NO PROGRAM | | FS2_2 |
| | A0023 | NO PROGRAM | | FS2_3 |
| | A0024 | NO PROGRAM | | FS2_4 |
| | A0025 | NO PROGRAM | | FS2_5 |
| | A0026 | NO PROGRAM | | FS2_6 |
| | A0027 | NO PROGRAM | | FS2_7 |
| FS_GRP2 | A0028 | NO PROGRAM | | FS2_8 |

| | | | |
|---|---|---|---|
| | A0031 | ADDR2 | Z3 1 | FS3_1 |
| | A0032 | NO PROGRAM | | FS3_2 |
| | A0033 | NO PROGRAM | | FS3_3 |
| | A0034 | NO PROGRAM | | FS3_4 |
| | A0035 | NO PROGRAM | | FS3_5 |
| | A0036 | NO PROGRAM | | FS3_6 |
| | A0037 | NO PROGRAM | | FS3_7 |
| FS_GRP3 | A0038 | NO PROGRAM | | FS3_8 |

| | | | |
|---|---|---|---|
| | A0051 | ADDR3 | Z5 1 | FS5_1 |
| | A0052 | NO PROGRAM | | FS5_2 |
| | A0053 | NO PROGRAM | | FS5_3 |
| | A0054 | NO PROGRAM | | FS5_4 |
| | A0055 | NO PROGRAM | | FS5_5 |
| | A0056 | NO PROGRAM | | FS5_6 |
| | A0057 | NO PROGRAM | | FS5_7 |
| FS_GRP5 | A0058 | NO PROGRAM | | FS5_8 |

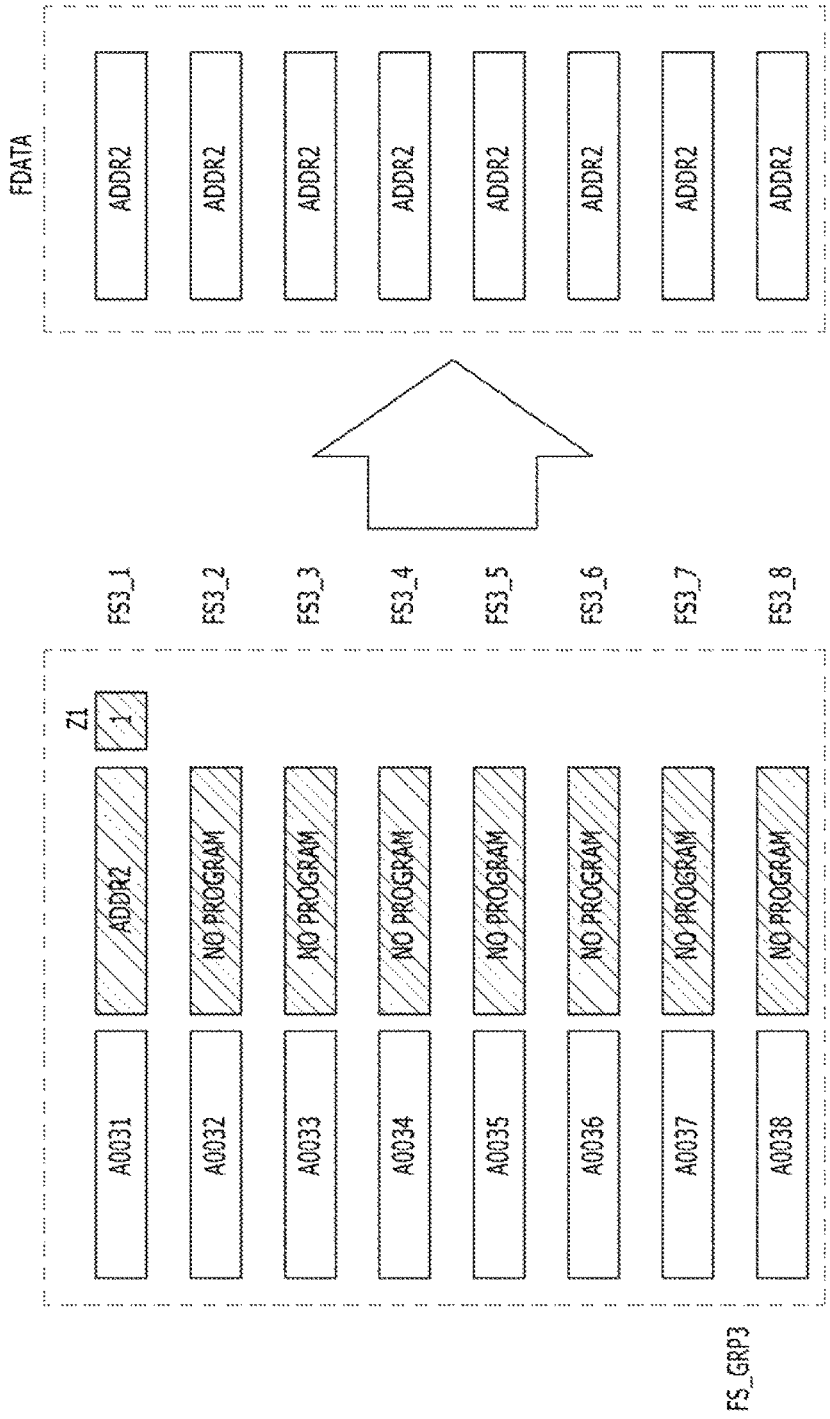

NONVOLATILE STORAGE CIRCUIT AND SEMICONDUCTOR MEMORY DEVICE INCLUDING THE SAME

CROSS-REFERENCE TO RELATED APPLICATIONS

The present application claims priority of Korean Patent Application No. 10-2017-0005026, filed on Jan. 12, 2017, which is incorporated herein by reference in its entirety.

BACKGROUND

1. Field

Exemplary embodiments relate to a semiconductor design technology and, more particularly, to a semiconductor memory device for transmitting data from a nonvolatile storage circuit to latch circuits, and an operating method thereof.

2. Description of the Related Art

A semiconductor device uses a nonvolatile memory, such as a fuse, for storing information, such as repair information, which is required for various internal control operations. In a fuse, data is identified according to whether or not the fuse has been cut by a laser, hence, it is possible to program the fuse only in a wafer state, and it is not possible to program the fuse after a wafer is mounted in a package. To overcome such a deficiency, an e-fuse may be used. An e-fuse represents a fuse that stores data by changing the resistance between a gate and a drain/a source of a transistor.

Recently, a method has been researched for storing information which is required for an internal operation of a semiconductor device by implementing an e-fuse in the form of an array. Implementing an e-fuse in the form of an array, allows sharing an amplifier between multiple e-fuses in the e-fuse array, thus reducing the footprint of the device.

Using the fuse data which are stored in an e-fuse array, requires a boot-up operation for transferring and storing the fuse data from the e-fuse array in to a latch circuit. Generally, e-fuses in the e-fuse array transmit the fuse data to the latch circuit in the boot-up operation in a one-to-one correspondence to unit latches in the latch circuit. After the boot-up operation, the semiconductor device may set internal circuits based on the data stored in the latch circuit and then may perform a normal operation.

Meanwhile, in a rupture operation for programming the fuse data in the e-fuse array, the fuse data may be programmed to a fuse set including a predetermined number of e-fuses. In this case, when it is necessary to continuously program substantially the same fuse data to different fuse sets, several rupture processes are required, resulting in an increase in current consumption and a test time.

SUMMARY

Various embodiments are directed to a nonvolatile storage circuit capable of grouping fuse sets into a predetermined number of fuse set groups and managing data of each fuse set group by using a flag fuse informing that fuse sets of each fuse set group program substantially the same data, and a semiconductor memory device including the same.

In an embodiment, a nonvolatile storage circuit may include a nonvolatile storage unit configured to include fuse set groups respectively including a plurality of fuse sets and a flag fuse; a rupture control unit configured to program an input address to the fuse sets in a first program mode, and to program a same input address to a specific fuse set among the plurality of fuse sets in a specific fuse set group among the fuse set groups and to program the flag fuse of the specific fuse set group in a second program mode; and a boot-up control unit configured to control the address programmed in the fuse sets to be outputted as fuse data, and to control the address programmed in the specific fuse set to be outputted as fuse data of remaining fuse sets among the plurality of fuse sets in the specific fuse set group.

In an embodiment, a semiconductor memory device may include a memory array area configured to include a normal cell area including normal cells and a redundancy cell area including redundancy cells to be replaced with repair target cells of the normal cells; a nonvolatile storage unit configured to include fuse set groups respectively including a plurality of fuse sets and a flag fuse; a rupture control unit configured to program a repair address of the repair target cells to the fuse sets in a rupture mode, and to program the repair address to a specific fuse set among the plurality of fuse sets in a specific fuse set group among the fuse set groups and to program a flag fuse of the specific fuse set group in an iterative program mode; a boot-up control unit configured to output the repair address programmed in the fuse sets as fuse data, and to control the repair address programmed in the specific fuse set to be outputted as fuse data of remaining fuse sets among the plurality of fuse sets in the specific fuse set group, in a boot-up mode; a latch circuit configured to store the fuse data; and a repair control circuit configured to control a repair operation of the repair target cells and the redundancy cells to be performed using the fuse data stored in the latch circuit.

In an embodiment, an operating method of a nonvolatile storage circuit may include providing a plurality of fuse set groups respectively including a plurality of fuse sets and a flag fuse, in the nonvolatile storage circuit; programming an input address to the fuse sets in a first program mode, and programming a same input address to a specific fuse set among the plurality of fuse sets in a specific fuse set group among the fuse set groups and programming the flag fuse of the specific fuse set group in a second program mode; and outputting the address programmed in the fuse sets as fuse data, and outputting the address programmed in the specific fuse set as fuse data of remaining fuse sets among the plurality of fuse sets in the specific fuse set group.

In the nonvolatile storage circuit in accordance with the embodiment, when substantially the same data is programmed to fuse sets different from one another, the data is programmed to only an initial fuse set and a flag fuse of a fuse set group including the fuse set is programmed to obtain data of the remaining fuse sets, so that it is possible to substantially prevent an unnecessary rupture operation and to reduce a current consumed in the rupture operation and a test time.

BRIEF DESCRIPTION OF THE DRAWINGS

FIG. 3 is a diagram illustrating a normal cell area of a memory array area shown in FIG. 2.

FIG. 7 is a diagram illustrating a normal cell area of a memory array area in order to facilitate the understanding of an operation shown in FIG. 6.

FIG. 8A and FIG. 8B are diagrams illustrating examples of a rupture state of a nonvolatile storage unit in order to facilitate the understanding of an operation shown in FIG. 6.

FIG. 10A and FIG. 10B are diagrams illustrating examples of fuse data read from a nonvolatile storage unit shown in FIG. 2 according to flag data in order to facilitate the understanding of an operation shown in FIG. 9.

DETAILED DESCRIPTION

Figure 1:
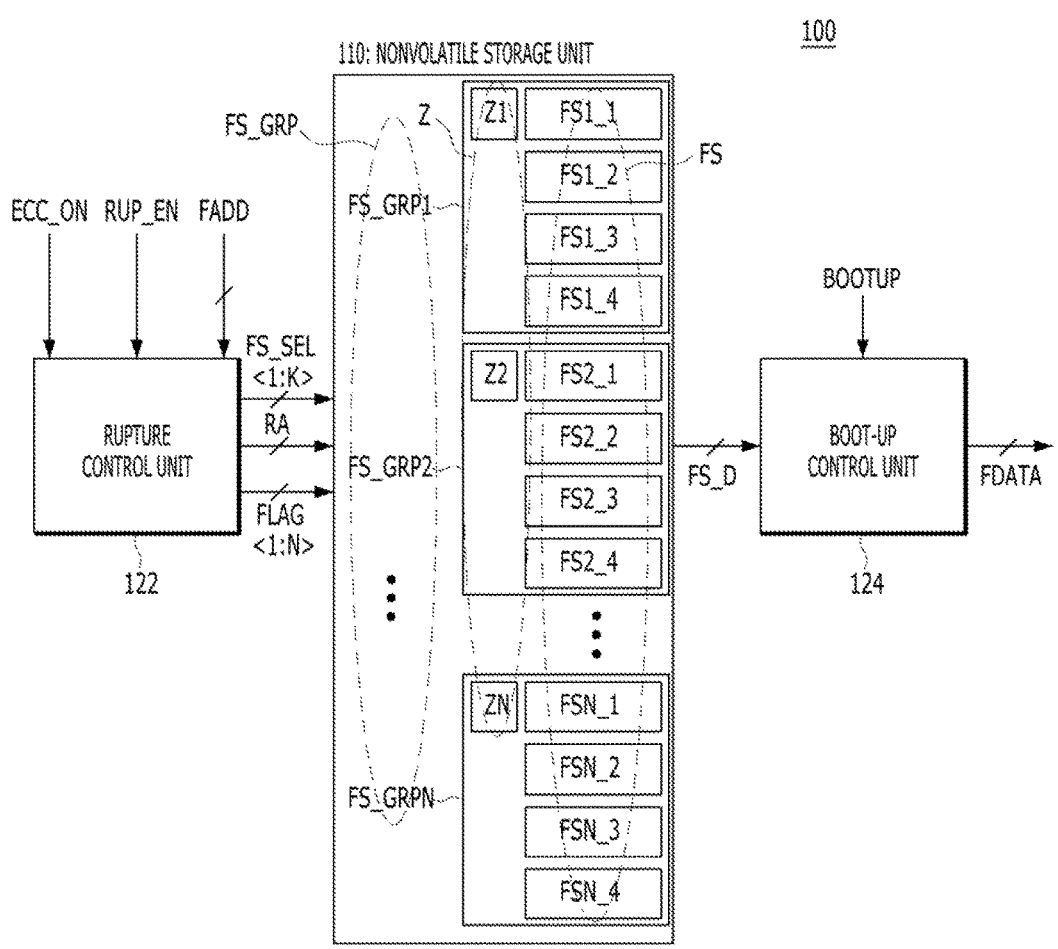
FIG. 1 is a block diagram illustrating a nonvolatile storage circuit in accordance with an embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In the following embodiment, for the purpose of convenience, a description will be provided, as an example, for the case in which a nonvolatile storage unit is configured with a fuse circuit such as an e-fuse array circuit and a repair address inputted from an exterior is programmed to each fuse set of the fuse circuit as fuse set data.

FIG. 1 is a block diagram illustrating a nonvolatile storage circuit 100 in accordance with an embodiment.

Referring FIG. 1, the nonvolatile storage circuit 100 may include a nonvolatile storage unit 110, a rupture control unit 122, and a boot-up control unit 124.

The nonvolatile storage unit 110 may include a plurality of fuse set groups FS_GRP, for example, N fuse set groups FS_GRP1 to FS_GRPN. Each of the plurality of fuse set groups FS_GRP1 to FS_GRPN may include a plurality of fuse sets FS and a flag fuse Z. A flag fuse Z may be assigned to each of the plurality of fuse set groups FS_GRP1 to FS_GRPN, for example, flag fuse Z1 may be assigned to the fuse set group FS_GRP1, flag fuse Z2 may be assigned to the fuse set group FS_GRP2, and flag fuse ZN may be assigned to fuse set group FS_GRPN. When the flag fuse Z is programmed to a specific value (for example, '1'), it may be determined that fuse sets FS included in a corresponding fuse set group FS_GRP program substantially the same repair address.

The nonvolatile storage unit 110 is described by employing an e-fuse array circuit as an example; however, the nonvolatile storage unit 110 may be configured with any one of nonvolatile memories such as a NAND flash memory, a NOR flash memory, a magnetic random access memory (MRAM), a spin transfer torque magnetic random access memory (STT-MRAM), a resistive random access memory (ReRAM), and a phase change random access memory (PCRAM).

Hereinafter, for the purpose of convenience, a description will be provided, as an example, for the case in which N fuse set groups FS_GRP1 to FS_GRPN include four fuse sets FS1_1 to FS1_4, FS2_1 to FS2_4, . . . , FSN_1 to FSN_4, and corresponding flag fuse Z1 to ZN, respectively.

The rupture control unit 122 may program an input address inputted or received from an exterior to the fuse sets FS in a program mode. In an iterative program mode in which substantially the same input address FADD is repeatedly programmed, the rupture control unit 122 may program the input address FADD to a specific fuse set FS and program the flag fuse Z of the fuse set group FS_GRP including the specific fuse set FS to a specific value. Preferably, the specific fuse set FS may be the first fuse set FSx_1 of each fuse set group FS_GRP. The number of fuse sets FS included in one fuse set group FS_GRP may be decided according to the number of times by which substantially the same input address FADD is continuously inputted in the iterative program mode.

For example, when substantially the same input address FADD is continuously inputted four times in the iterative program mode, the rupture control unit 122 may program the input address FADD to the first fuse set FS1_1 of the first fuse set group FS_GRP1 only once and program the first flag fuse Z1 to '1'. That is, even though substantially the same input address FADD is not additionally and repeatedly programmed three times to the remaining second to fourth fuse sets FS1_2 to FS1_4 of the first fuse set group FS_GRP1, the first flag fuse Z1 is programmed to '1', so that it is possible to complete a program operation for substantially the same input address FADD. The program mode may correspond to a rupture mode in which fuses included in the fuse set FS are ruptured, and the iterative program mode may correspond to a mode in which the program operation is performed in a state in which an on-chip error correction code (ECC) mode has been activated. In the on-chip ECC mode, an ECC function is provided in a semiconductor device including the nonvolatile storage circuit. Detailed description thereof will be given later.

In more detail, when a rupture enable signal RUP_EN is activated, the rupture control unit 122 may enter the program mode. When both the rupture enable signal RUP_EN and an on-chip ECC mode signal ECC_ON are activated, the rupture control unit 122 may enter the iterative program mode. When the rupture enable signal RUP_EN is activated and the on-chip ECC mode signal ECC_ON is deactivated, the rupture control unit 122 may generate a repair address RA based on the input address FADD inputted from an external device, and generate a fuse set selection signal FS_SEL<1:K> for selecting a fuse set FS to which the repair address RA is to be programmed. In this case, since the on-chip ECC mode signal ECC_ON has been deactivated, a flag setting signal FLAG<1:N> is not generated.

When both the rupture enable signal RUP_EN and the on-chip ECC mode signal ECC_ON are activated, the rupture control unit 122 may generate the repair address RA based on substantially the same input address FADD continuously inputted a predetermined number of times, and generate the fuse set selection signal FS_SEL<1:K> for selecting the fuse set FS, to which the repair address RA is to be programmed, and the flag setting signal FLAG<1:N> for programming the flag fuse Z of the fuse set group FS_GRP including the selected fuse set FS. For example, the rupture control unit 122 may generate a fuse set selection signal FS_SEL<1:K> for selecting the first fuse set FSx_1 of each set group FS_GRP, and generate a flag setting signal FLAG<1:N> for programming the flag fuse Z of the fuse set group FS_GRP including the selected fuse set FS to '1'. In this case, the rupture control unit 122 does not generate a fuse set selection signal FS_SEL<1:K> for programming the remaining second to fourth fuse sets FSx_2 to FSx_4 of the fuse set group FS_GRP. Accordingly, the repair address RA is not programmed to the remaining second to fourth fuse sets FSx_2 to FSx_4 of the fuse set group FS_GRP.

The boot-up control unit 124 may control a repair address RA which is programmed to a fuse set FS to be outputted as fuse data FDATA, in a read mode. In the case of a fuse set group FS_GRP in which the flag fuse Z has been programmed to a specific value, the boot-up control unit 124 may control the repair address RA which is programmed to a specific fuse set FS to be outputted as the fuse data FDATA of the remaining fuse sets FS of the fuse set group FS_GRP. For example, when the first flag fuse Z1 has been programmed to '1', in the read mode, the boot-up control unit 124 may control the repair address RA programmed to the first fuse set FS1_1 of the first fuse set group FS_GRP1 to be outputted as the fuse data FDATA of the remaining second to fourth fuse sets FS1_2 to FS1_4 of the first fuse set group FS_GRP1. The read mode may correspond to a boot-up mode in which a repair address stored in a fuse circuit is read.

In more detail, when a boot-up signal BOOTUP is activated, the boot-up control unit 124 may enter the read mode. When the boot-up signal BOOTUP is activated, the boot-up control unit 124 may receive fuse set data FS_D outputted from the nonvolatile storage unit 110 and may output the fuse data FDATA. In this case, the fuse set data FS_D may include physical location information (PLI) of each fuse set, repair address information (RAI) programmed to each fuse set FS, and flag data programmed to the flag fuse Z. In the case of a fuse set group FS_GRP in which the flag data has been programmed to a specific value, the boot-up control unit 124 may control the repair address RA programmed to the first fuse set FSx_1 to be outputted as the fuse data FDATA of the remaining second to fourth fuse sets FSx_2 to FSx_4 of the fuse set group FS_GRP, based on the fuse set data FS_D. Meanwhile, a configuration (not illustrated), which generates a control signal for selecting each fuse set of the nonvolatile storage circuit 100 and controlling the fuse set data FS_D to be outputted in a read operation, may be additionally provided.

As described above, the nonvolatile storage circuit in accordance with an embodiment of the present invention may group internal fuse sets into a predetermined number of groups, and selectively program a flag fuse for a group denoting whether or not the fuse sets of the corresponding fuse set group is programming substantially the same data. That is, in the program mode, when substantially the same input address is repeatedly programmed to different fuse sets, the input address may be programmed only to an initial fuse set of one fuse set group and an additional program operation is not performed for the remaining fuse sets, and in the read mode, data of the remaining fuse sets is obtained using the flag fuse, thus reducing the number of rupture operations which may otherwise be needed for programming the same fuse data to different fuse sets. Reducing the number of rupture operations may also reduce the power consumption and the time required for the rupture operation.

Hereinafter, the case in which the nonvolatile storage circuit is mounted in a semiconductor memory device, will be described as a detailed example.

In the semiconductor memory device, after design and manufacturing, a failed memory cell (hereinafter, referred to as a 'repair target memory cell') may be detected through a test process at a wafer level and/or after a package level. An address (hereinafter, referred to as a 'repair address') corresponding to the detected repair target memory cell is programmed to a fuse circuit of an e-fuse array and the like. In a boot-up operation, the semiconductor memory device stores repair information programmed to the fuse circuit in a latch circuit, and forms a redundant path between the repair target memory cell and a redundancy memory cell based on the repair information. In a normal operation, when an address corresponding to the repair address is inputted, the semiconductor memory device may perform an operation (hereinafter, referred to as a 'repair operation') for accessing the redundancy memory cell, instead of the repair target memory cell, based on the redundant path. Through such a repair operation, the semiconductor memory device performs an ordinary operation.

As the size of the semiconductor memory device is reduced, failed data is randomly generated, resulting in an increase in a soft error. In order to solve such a problem, an on-chip ECC scheme in which an ECC function is provided in a memory device, has been employed recently. That is, in order to ensure a yield of the semiconductor memory device, the repair operation may be performed to replace the repair target memory cell with a redundancy memory cell, or the repair target memory cell may be repaired using the on-chip ECC scheme.

In order to perform the on-chip ECC scheme, an ECC parity bit may be assigned to a specific space for storage. Particularly, in the case of a semiconductor memory device employing the on-chip ECC scheme, there has been proposed a method for assigning the ECC parity bit to a part of a memory array area.

Figure 2:
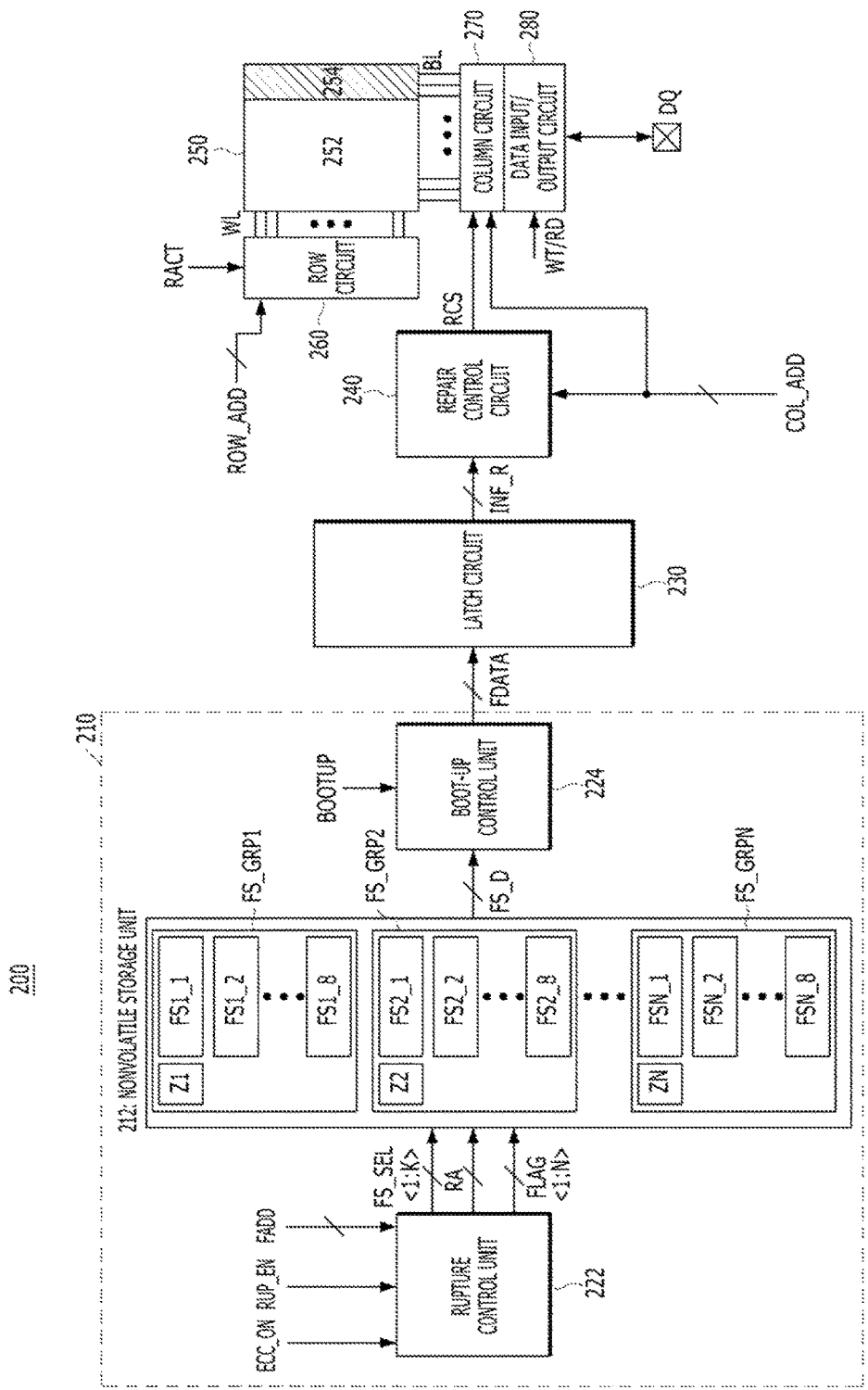
FIG. 2 is a block diagram illustrating a semiconductor memory device in accordance with an embodiment.

FIG. 2 is a block diagram illustrating a semiconductor memory device 200 in accordance with an embodiment. Hereinafter, the case in which a column repair operation is performed will be described as an example; however, the embodiment is not limited thereto and may also be applied to the case in which a row repair operation is performed.

Referring to FIG. 2, the semiconductor memory device 200 may include a nonvolatile storage circuit 210, a latch circuit 230, a repair control circuit 240, a memory array area 250, a row circuit 260, a column circuit 270, and a data input/output circuit 280.

The memory array area 250 may include a normal cell area 252 including normal cells and a redundancy cell area 254 including redundancy cells which can replace repair target cells of the normal cells. The memory cells of the memory array area 250 may be electrically coupled to the row circuit 260 through a word line WL and to the column circuit 270 through a bit line BL. The memory array area 250 may include volatile memory cells. Preferably, the memory array area 250 may include dynamic random access memory (DRAM) cells.

The nonvolatile storage circuit 210 may include a nonvolatile storage unit 212, a rupture control unit 222, and a boot-up control unit 224.

The nonvolatile storage unit 212 may include a plurality of fuse sets FS for programming a column address (that is, a repair address) of repair target cells. The nonvolatile storage unit 212 may include a plurality of fuse set groups FS_GRP1 to FS_GRPN respectively including the plurality of fuse sets FS and a flag fuse Z. Since the nonvolatile storage unit 212 of FIG. 2 is substantially identical to the nonvolatile storage unit 110 of FIG. 1, a detailed description thereof will be omitted. Hereinafter, for the purpose of convenience, a description will be provided, as an example, for the case in which each of the N fuse set groups FS_GRP1 to FS_GRPN include 8 fuse sets and a flag fuse. Specifically, the N fuse set groups FS_GRP1 to FS_GRPN include FS1_1 to FS1_8, FS2_1 to FS2_8, . . . , FSN_1 to FSN_8 fuse sets, respectively, and corresponding flag fuses Z1 to ZN.

In a rupture mode in which a rupture enable signal RUP_EN is activated, the rupture control unit 222 may generate a repair address RA based on an input address FADD inputted from an external device, and generate a fuse set selection signal FS_SEL<1:K> for selecting a fuse set FS to which the repair address RA is to be programmed. Particularly, in an iterative program mode in which both the rupture enable signal RUP_EN and an on-chip ECC mode signal ECC_ON are activated, the rupture control unit 222 may generate the repair address RA based on the input address FADD, and generate the fuse set selection signal FS_SEL<1: K> for selecting the fuse set FS, to which the repair address RA is to be programmed, and a flag setting signal FLAG<1:N> for programming the flag fuse Z of the fuse set group FS_GRP including the selected fuse set FS. The on-chip ECC mode signal ECC_ON is a signal that is activated in an on-chip ECC mode. Since the rupture control unit 222 of FIG. 2 is substantially the same to the rupture control unit 122 of FIG. 1, a detailed description thereof will be omitted.

The boot-up control unit 224 may receive fuse set data FS_D outputted from the plurality of fuse sets FS and output the fuse data FDATA to the latch circuit 230 in a boot-up mode in which a boot-up signal BOOTUP is activated. Particularly, in the case of a fuse set group FS_GRP in which the flag fuse Z has been programmed to a specific value, the boot-up control unit 224 may control the repair address RA programmed to the first fuse set FSx_1 to be outputted as the fuse data FDATA of the remaining second to eighth fuse sets FSx_2 to FSx_8 of the fuse set group FS_GRP, based on the fuse set data FS_D. Since the boot-up control unit 224 of FIG. 2 is substantially the same to the boot-up control unit 124 of FIG. 1, a detailed description thereof will be omitted.

The latch circuit 230 may store the fuse data FDATA provided from the nonvolatile storage circuit 210 and output repair information INF_R to the repair control circuit 240. The latch circuit 230 may include unit latches corresponding to fuses of the nonvolatile storage circuit 210 in a one-to-one fashion.

The repair control circuit 240 may compare the repair information INF_R provided from the latch circuit 230 with a column address COL_ADD inputted from an exterior, and output a repair control signal RCS. When the repair information INF_R and the column address COL_ADD coincide with each other, the repair control circuit 240 may activate the repair control signal RCS and output the activated repair control signal RCS to the column circuit 270.

The column circuit 270 may access data of a bit line BL selected by a column selection signal Yi (not illustrated) generated by decoding the column address COL_ADD, and activate a redundancy bit line, instead of the bit line BL accessed by the column address COL_ADD, when the repair control signal RCS is activated. Accordingly, a repair target cell corresponding to the repair information INF_R stored in the latch circuit 230 may be replaced with a repair cell.

The row circuit 260 may activate a word line WL, which has been selected by a row address ROW_ADD, in response to a row active command RACT.

The data input/output circuit 280 may output data, which is transferred from the bit line BL selected by the column address COL_ADD, to a data (DQ) pad in response to a read signal RD in a read operation, and store data inputted to the bit line BL corresponding to the column address COL_ADD through the DQ pad in response to a write signal WT in a write operation.

In more detail, the normal cell area 252 may include normal cells for storing normal data. In the normal cell area 252, repair target cells with defects in test processes may exist. The repair target cells may include cells with hardware defects, cells indicating deterioration of various element properties, for example, cells with a short refresh time, cells showing deterioration of cell write characteristics or a variable retention time, and the like. A word line and a bit line, to which a repair target cell is electrically coupled, may be addressed by a row repair address and a column repair address.

The redundancy cell area 254 may be divided into areas for row repair and column repair. In the embodiment, a description will be provided, as an example, for the case in which the redundancy cell area 254 is a redundancy cell area for column repair and a repair address to be stored in the nonvolatile storage unit 212 is a column repair address.

FIG. 3 is a diagram illustrating the normal cell area 252 of the memory array area 250 of FIG. 2.

Referring to FIG. 3, in order to support the on-chip ECC scheme, a part of the normal cell area 252 may include an ECC cell area ECCP for additionally storing an ECC parity bit. When the on-chip ECC scheme is used, the ECC cell area ECCP may store the parity bit, and when the on-chip ECC scheme is not used, the ECC cell area ECCP may store normal data.

For the purpose of the column repair, the normal cell area 252 may include a plurality of sub-sections defined by a plurality of row sections RS and a plurality of column sections CS. For example, when the normal cell area 252 is divided into first to fifth row sections RS1 to RS5 and first to eighth column sections CS1 to CS8, the normal cell area 252 may be divided into 40 sub-sections R1C1 to R1C8, R2C1 to R2C8, R3C1 to R3C8, R4C1 to R4C8, and R5C1 to R5C8. FIG. 3 illustrates the case in which the eighth column section CS8 is assigned as the ECC cell area ECCP. The redundancy cell area (254 of FIG. 2) may include redundancy cells corresponding to the sub-sections R1C1 to R1C8, R2C1 to R2C8, R3C1 to R3C8, R4C1 to R4C8, and R5C1 to R5C8, and the redundancy cells of the redundancy cell area 254 may correspond to the fuse sets of the nonvolatile storage circuit (210 of FIG. 2). For example, when the normal cell area 252 is divided into 40 sub-sections R1C1 to R1C8, R2C1 to R2C8, R3C1 to R3C8, R4C1 to R4C8, and R5C1 to R5C8, the nonvolatile storage circuit 210 may include 40 fuse sets for storing 40 column repair addresses.

In a test, when a word line WL selected by the row address ROW_ADD is activated and a column selection signal Yi corresponding to the column address COL_ADD is activated, data is outputted from a predetermined number of bit lines BL in the sub-sections R1C1 to R5C8. For example, when the column selection signal Yi corresponding to the column address COL_ADD is activated, 8 bit lines BL are selected in the sub-sections R1C1 to R1C8, R2C1 to R2C8, R3C1 to R3C8, R4C1 to R4C8, and R5C1 to R5C8, so that 8 chunks of data may be outputted from the sub-sections R1C1 to R1C8, R2C1 to R2C8, R3C1 to R3C8, R4C1 to R4C8, and R5C1 to R5C8. A test device (not illustrated) may add up data loaded to the predetermined number of bit lines BL, detect a repair target memory cell of the specific sub-sections R1C1 to R1C8, R2C1 to R2C8, R3C1 to R3C8, R4C1 to R4C8, and R5C1 to R5C8, and program a column address (that is, a column repair address) of the detected repair target memory cell to fuse sets corresponding to the specific sub-sections R1C1 to R1C8, R2C1 to R2C8, R3C1 to R3C8, R4C1 to R4C8, and R5C1 to R5C8.

In the on-chip ECC mode in which the on-chip ECC scheme is used, when a parity bit is generated by a failed bit, it is not possible to recognize which fuse set among the fuse sets corresponding to a sub-section included in substantially the same row section RS, which is used in a repair operation. Accordingly, at the present time, all the fuse sets corresponding to the sub-sections included in substantially the same row section RS are programmed. That is, in the on-chip ECC mode, when the parity bit is generated by the failed bit, all the fuse sets corresponding to the sub-sections included in substantially the same row section RS are programmed with substantially the same column repair address.

In an embodiment of the present invention, it is possible to group the fuse sets corresponding to the sub-sections included in substantially the same row section RS into one fuse set group FS_GRP. That is, one fuse set group FS_GRP may be grouped to include fuse sets corresponding to the number of column sections CS, and the number of fuse set groups FS_GRP may correspond to the number of row sections RS. For example, one fuse set group FS_GRP of FIG. 2 may include 8 fuse sets FSx_1 to FSx_8 corresponding to the first to eighth column sections CS1 to CS8 of FIG. 3, and five fuse set groups FS_GRP of FIG. 2 may be provided corresponding to the first to fifth row sections RS1 to RS5.

Accordingly, when the fuse sets corresponding to the sub-sections included in substantially the same row section RS are grouped into one fuse set group and the parity bit is generated by the failed bit in the on-chip ECC mode, a repair address is programmed only to an initial fuse set of the one fuse set group and an additional program operation is performed for the remaining fuse sets, so that it is possible to obtain data of the remaining fuse sets by using a flag fuse in the read mode. For example, in the on-chip ECC mode, when the parity bit is generated by the failed bit in the second row section RS2, the rupture operation should be performed 8 times for the first to eighth fuse sets FS2_1 to FS2_8 of the second fuse set group FS_GRP2 corresponding to the sub-sections R2C1 to R2C8 positioned in the second row section RS2 in the related art. However, in the embodiment of the present invention, the rupture operation is performed only for the first fuse set FS2_1 of the second fuse set group FS_GRP2 and 7 rupture operations for the remaining second to eighth fuse sets FS2_2 to FS2_8 may be omitted. Consequently, it is possible to reduce the number of needed rupture operations and also reduce the current consumed in the rupture operation and the test time.

Hereinafter, with reference to the accompanying drawings, a detailed configuration of the nonvolatile storage unit 212 will be described.

Figure 4A:
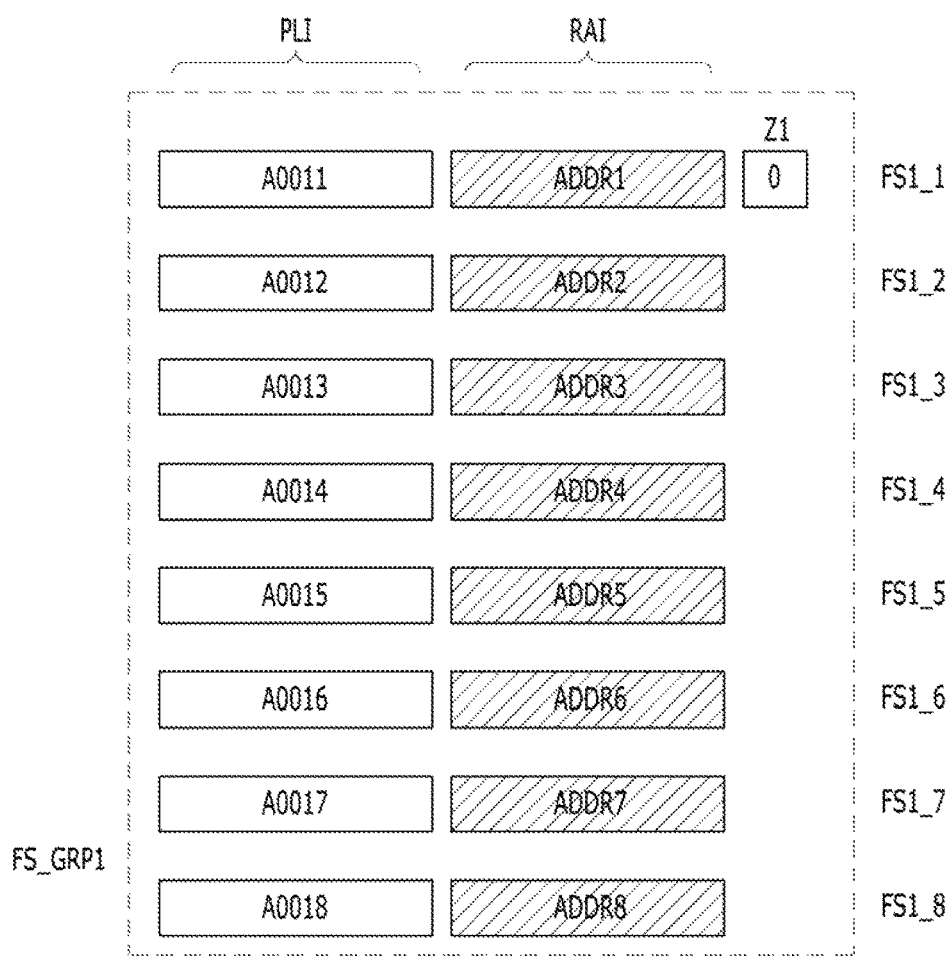
FIG. 4A and FIG. 4B are diagrams illustrating examples of a rupture state of a nonvolatile storage unit shown in FIG. 2 according to an on-chip ECC mode.
Figure 4B:
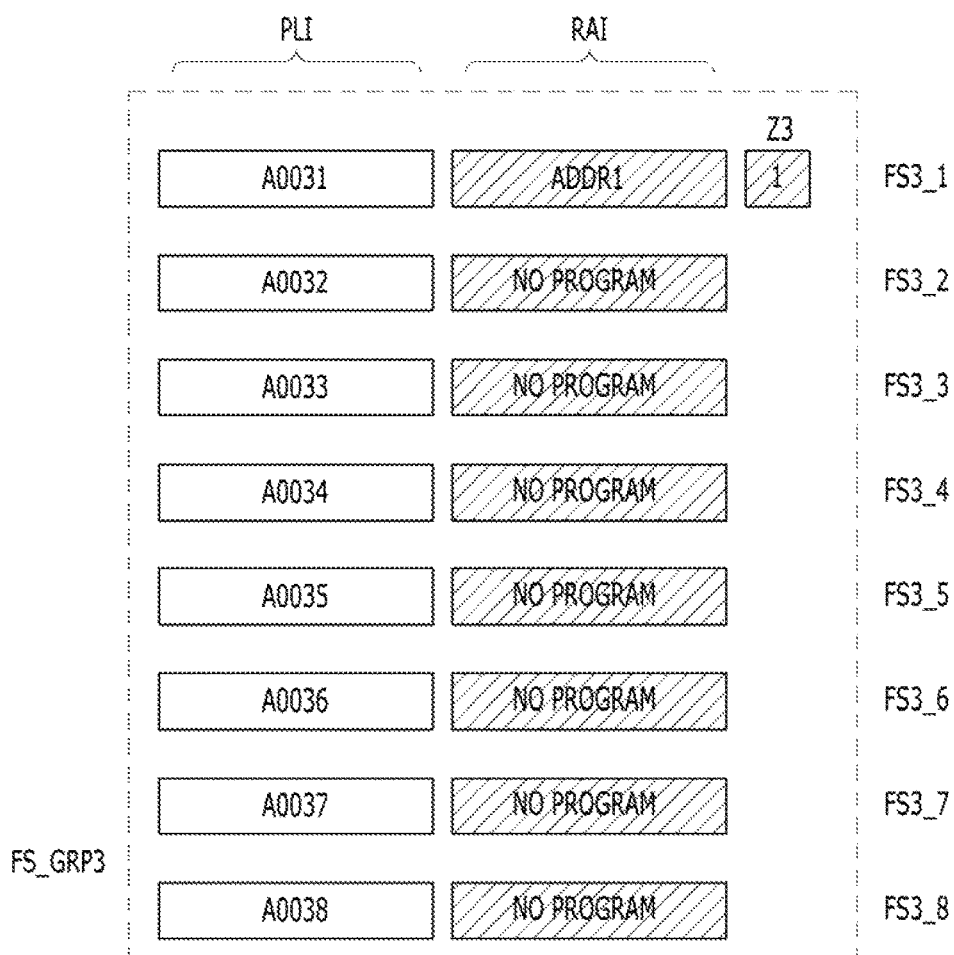

FIG. 4A and FIG. 4B are diagrams illustrating examples of a rupture state of the nonvolatile storage unit 212 of FIG. 2 according to the on-chip ECC mode. For the purpose of convenience, FIG. 4A illustrates the first fuse set group FS_GRP1 of the nonvolatile storage unit 212 and FIG. 4B illustrates the third fuse set group FS_GRP3 of the nonvolatile storage unit 212; however, the embodiment is not limited thereto.

In FIG. 4A and FIG. 4B, the first to eighth fuse sets FS1_1 to FS1_8 of the first fuse set group FS_GRP1 and the first to eighth fuse sets FS3_1 to FS3_8 of the third fuse set group FS_GRP3 may include physical address information PLI and repair address information RAI, respectively. For example, physical addresses A0011 to A0018 may be respectively assigned to the first to eighth fuse sets FS1_1 to FS1_8 and physical addresses A0031 to A0038 may be respectively assigned to the first to eighth fuse sets FS3_1 to FS3_8. Accordingly, the nonvolatile storage unit 212 may select a specific fuse set according to physical address information PLI included in the fuse set selection signal FS_SEL<1:K> provided from the rupture control unit 222, and rupture repair address information RAI included in the repair address RA.

FIG. 4A illustrates the state in which the first to eighth fuse sets FS1_1 to FS1_8 of the first fuse set group FS_GRP1 of the nonvolatile storage unit 212 have been ruptured when the on-chip ECC mode is not activated. When the on-chip ECC mode is not activated, the first to eighth fuse sets FS1_1 to FS1_8 of the first fuse set group FS_GRP1 respectively program separate repair addresses ADDR1 to ADDR8. In this case, the flag fuse Z1 has not been programmed.

FIG. 4B illustrates the state in which the first to eighth fuse sets FS3_1 to FS3_8 of the third fuse set group FS_GRP3 of the nonvolatile storage unit 212 have been ruptured when the on-chip ECC mode is activated. When the on-chip ECC mode is activated, the first fuse set FS3_1 of the third fuse set group FS_GRP3 programs the repair address ADDR1, but the remaining second to eighth fuse sets FS3_2 to FS3_8 have not been programmed. In this case, the flag fuse Z3 has been programmed to '1'. Accordingly, even though the second to eighth fuse sets FS3_2 to FS3_8 have not been programmed, since the flag fuse Z3 has been set to '1', it may be determined in a boot-up operation that the second to eighth fuse sets FS3_2 to FS3_8 are programming substantially the same address as the repair address ADDR1 programmed to the first fuse set FS3_1.

Figure 5:
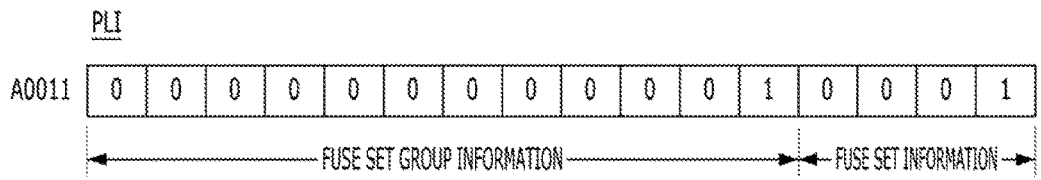
FIG. 5 is a diagram illustrating physical address information (PU) of a fuse set (FS) shown in FIG. 4A.

FIG. 5 is a diagram illustrating physical address information PLI of the fuse set FS of FIG. 4A.

Referring to FIG. 5, the physical address information PLI may include fuse set group information and fuse set information.

For example, when the fuse set selection signal FS_SEL<1:K> generated in the rupture control unit 222 is "0000 0000 0001 0001" of 16 bits, the lower 4 bits may be used as fuse set information for selecting a fuse set and the upper 12 bits may be used as fuse set group information for selecting a fuse set group. Accordingly, when the fuse set selection signal FS_SEL<1:K> is "0000 0000 0001 0001" of 16 bits, the first fuse set FS1_1 of the first fuse set group FS_GRP1 may be designated.

Figure 6:
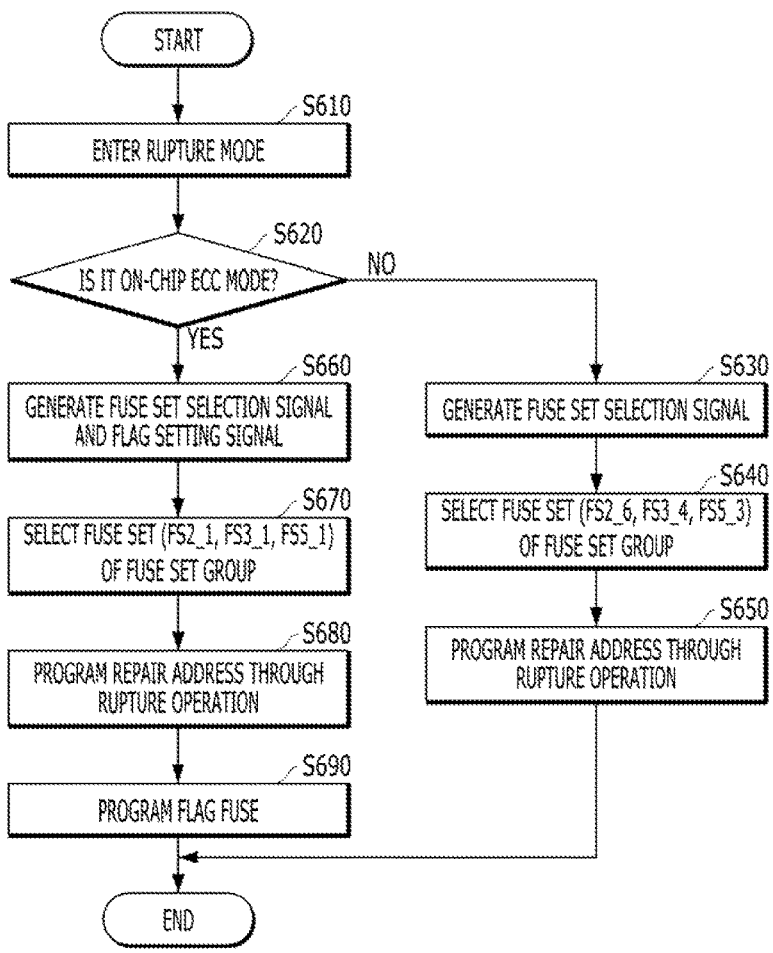
FIG. 6 is a flowchart illustrating an operation of a rupture control unit shown in FIG. 2.

FIG. 6 is a flowchart illustrating an operation of the rupture control unit 222 of FIG. 2. FIG. 7 is a diagram illustrating the normal cell area 252 of the memory array area 250 in order to facilitate the understanding of the operation of FIG. 6, and FIG. 8A and FIG. 8B are diagrams illustrating examples of a rupture state of the nonvolatile storage unit 212 in order to facilitate the understanding of the operation of FIG. 6.

Referring to FIG. 6, the rupture control unit 222 may enter the rupture mode when the rupture enable signal RUP_EN is activated (S610).

When the on-chip ECC mode signal ECC_ON is deactivated (NO of S620), the rupture control unit 222 may generate the repair address RA based on the input address FADD inputted from an exterior, and generate the fuse set selection signal FS_SEL<1:K> for selecting a fuse set FS to which the repair address RA is to be programmed (S630). Accordingly, a fuse set FS (e.g., FS2_6, FS3_4, FS5_3) of a fuse set group FS_GRP designated by physical address information PLI included in the fuse set selection signal FS_SEL<1:K> may be selected (S640), and the repair address RA may be programmed to repair address information RAI of the selected fuse set FS through a rupture operation (S650). In this case, since the on-chip ECC mode signal ECC_ON has been deactivated, no flag setting signal FLAG<1:N> is generated.

However, when the on-chip ECC mode signal ECC_ON is activated (YES of S620), the rupture control unit 222 may generate the repair address RA based on substantially the same input address FADD continuously inputted a predetermined number of times (for example, eight times), and generate the fuse set selection signal FS_SEL<1:K> for selecting a fuse set FS to which the repair address RA is to be programmed and the flag setting signal FLAG<1:N> for programming the flag fuse Z of the fuse set group FS_GRP including the selected fuse set FS (S660). Accordingly, a fuse set FS (e.g., FS2_1, FS3_1, FS5_1) of a fuse set group FS_GRP designated by physical address information PU included in the fuse set selection signal FS_SEL<1:K> may be selected (S670), and the repair address RA may be programmed to repair address information RAI of the selected fuse set FS (S680). In this case, a flag fuse Z of the fuse set group FS_GRP including the selected fuse set FS may be programmed to '1' according to the flag setting signal FLAG<1:N> (S690).

FIG. 7 illustrates the case in which a repair target memory cell DEFECT has occurred in a sub-section R2C6, a sub-section R3C4, and a sub-section R5C3 of the normal cell area 252. FIG. 8A and FIG. 8B illustrate a rupture state of the nonvolatile storage unit 212 according to the on-chip ECC mode when the repair target memory cell DEFECT of FIG. 7 has occurred.

FIG. 8A illustrates the rupture state of the nonvolatile storage unit 212 after steps S630 and S640 of FIG. 6 are performed when the on-chip ECC mode is not activated. When the on-chip ECC mode is not activated, the rupture control unit 222 may program the repair address RA to fuse sets corresponding to the sub-sections R2C6, R3C4, and R5C3. That is, the rupture control unit 222 may program the repair address ADDR1 to the sixth fuse set FS2_6 of the second fuse set group FS_GRP2 corresponding to the sub-section R2C6, program the repair address ADDR2 to the fourth fuse set FS3_4 of the third fuse set group FS_GRP3 corresponding to the sub-section R3C4, and program the repair address ADDR3 to the third fuse set FS5_3 of the fifth fuse set group FS_GRP5 corresponding to the sub-section R5C3.

FIG. 8B illustrates the rupture state of the nonvolatile storage unit 212 after steps S660 and S670 of FIG. 6 are performed in the on-chip ECC mode. In the on-chip ECC mode, when a parity bit is generated in the second row section RS2, the third row section RS3, and the fifth row section RS5 by a failed bit, the rupture control unit 222 may program the repair address ADDR1 only to the first fuse set FS2_1 of the second fuse set group FS_GRP2 and program only the flag fuse Z2 to '1' instead of performing an additional program operation for the remaining second to eighth fuse sets FS2_2 to FS2_8. Similarly, the rupture control unit 222 may respectively program the repair addresses ADDR2 and ADDR3 only to the first fuse set FS3_1 of the third fuse set group FS_GRP3 and the first fuse set FS5_1 of the fifth fuse set group FS_GRP5, and program only the flag fuses Z3 and Z5 to '1' instead of performing an additional program operation for the remaining fuse sets FS3_2 to FS3_8 and FS5_2 to FS5_8, thereby completing the program operation for substantially the same input address FADD continuously inputted.

That is, in the on-chip ECC mode, when a parity bit is generated in the second row section RS2, the third row section RS3, and the fifth row section RS5 by a failed bit, an existing rupture control unit should perform a program operation for the first fuse set FS2_1 to the eighth fuse set FS2_8 of the second fuse set group FS_GRP2 eight times, perform a program operation for the first fuse set FS3_1 to the eighth fuse set FS3_8 of the third fuse set group FS_GRP3 eight times, and perform a program operation for the first fuse set FS5_1 to the eighth fuse set FS5_8 of the fifth fuse set group FS_GRP5 eight times. However, in the embodiment, a program operation may be performed only for the first fuse set FSx_1 of a corresponding fuse set group FS_GRP, the flag fuse Z of the fuse set group including the first fuse set FSx_1 may be programmed, and a program operation for the remaining second to eighth fuse sets FSx_2 to FSx_8 may be omitted.

Figure 9:
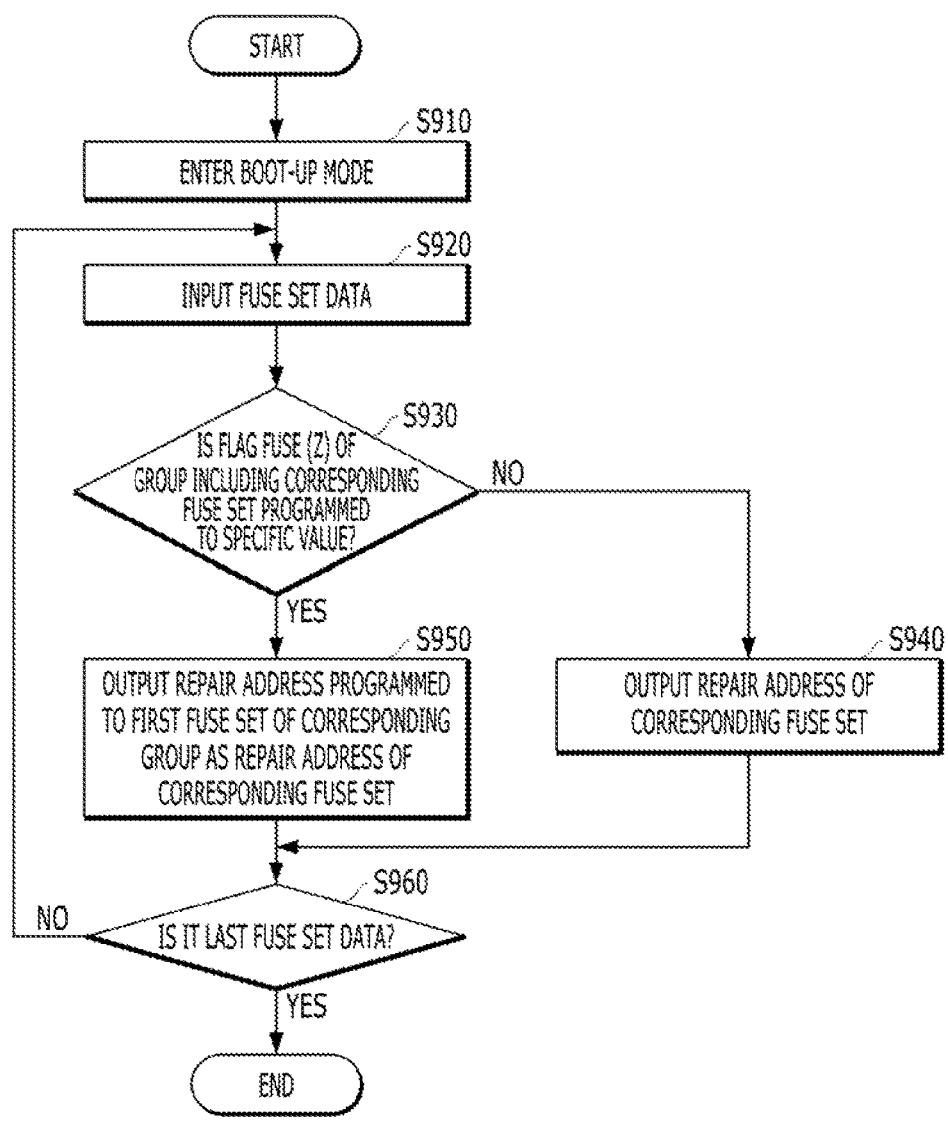
FIG. 9 is a flowchart illustrating an operation of a boot-up control unit shown in FIG. 2.
Figure 10A:
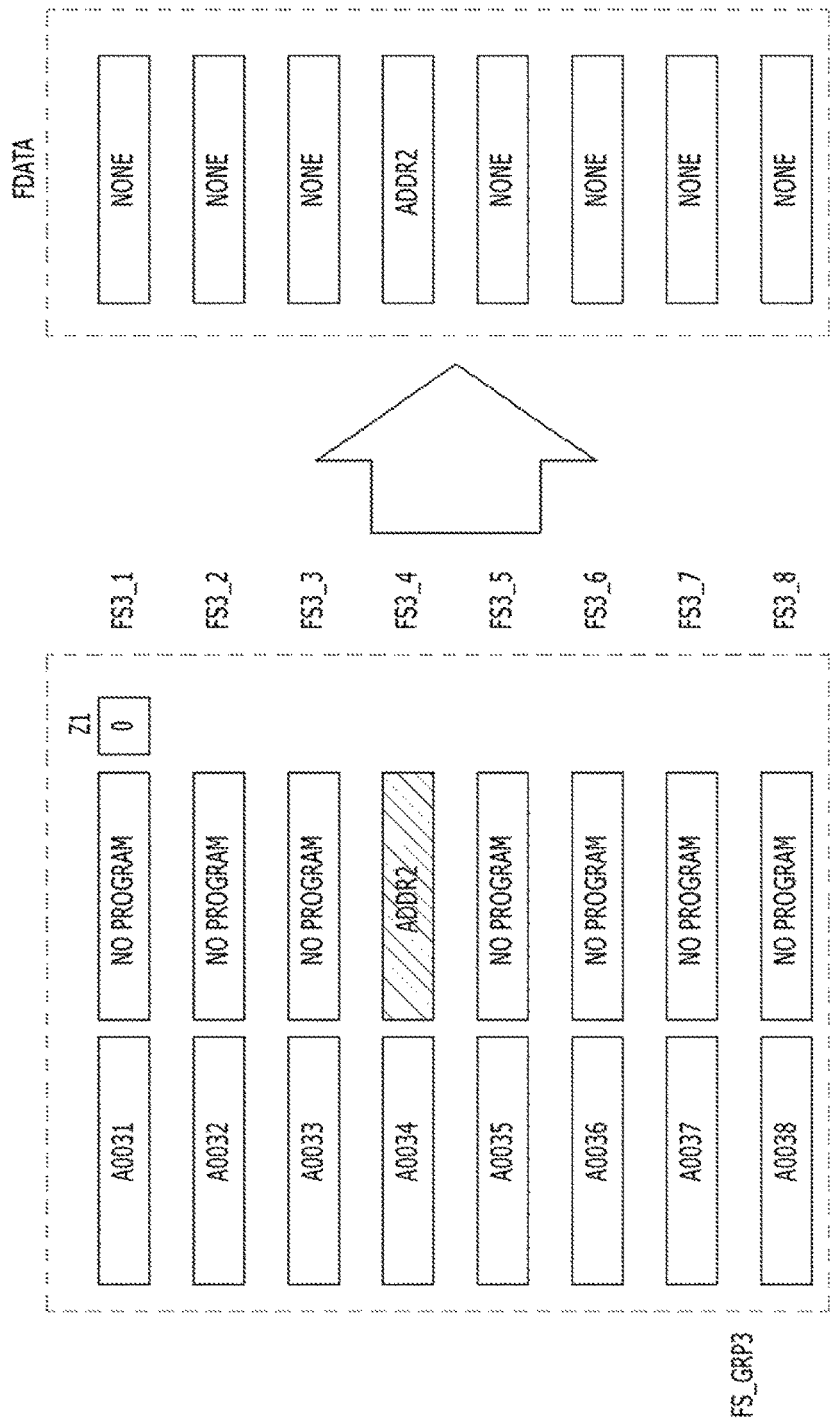

FIG. 9 is a flowchart illustrating an operation of the boot-up control unit 224 of FIG. 2. FIG. 10A and FIG. 10B are diagrams illustrating examples of fuse data read from the nonvolatile storage unit 212 of FIG. 2 according to flag data in order to facilitate the understanding of an operation of FIG. 9.

Referring to FIG. 9, the boot-up control unit 224 may enter the boot-up mode when the boot-up signal BOOTUP is activated (S910).

The boot-up control unit 224 may receive fuse set data FS_D outputted from a plurality of fuse sets FS (S920). The fuse set data FS_D may include physical address information PU of each fuse set, repair address information RAI programmed to each fuse set, and flag data programmed to the flag fuse Z.

In the case of a fuse set group FS_GRP in which the flag data is not programmed to a specific value (for example, '1') (NO of S930), the boot-up control unit 224 may control a repair address RA programmed to the fuse set FS of the fuse set group FS_GRP to be outputted as fuse data FDATA (S940). For example, as illustrated in FIG. 10A, when the flag data is '0', the boot-up control unit 224 may control a repair address RA programmed to the fuse sets FS3_1 to FS3_8 of the third fuse set group FS_GRP3 to be outputted as the fuse data FDATA. In this case, since only the fourth fuse set FS3_4 of the third fuse set group FS_GRP3 has been programmed, only the fuse set data FS_D of the fourth fuse set FS3_4 may be outputted as the fuse data FDATA.

However, in the case of a fuse set group FS_GRP in which the flag data has been programmed to the specific value (for example, '1') (YES of S930), the boot-up control unit 224 may control a repair address RA programmed to the first fuse set FSx_1 to be outputted as fuse data FDATA of all the fuse sets FSx_1 to FSx_8 of the fuse set group FS_GRP (S950). For example, as illustrated in FIG. 10B, when the flag data is '1', the boot-up control unit 224 may control a repair address RA programmed to the first fuse set FS3_1 of the third fuse set group FS_GRP3 to be outputted as the fuse data FDATA of all the fuse sets FS3_1 to FS3_8 of the third fuse set group FS_GRP3. As described above, in the boot-up mode, it is possible to obtain data of remaining fuse sets by using the flag fuse.

The above steps S920, S930, S940, S950, and S960 may be repeated until the fuse set data FS_D is outputted from the last fuse set of the last fuse set group.

Then, the latch circuit 230 may store the fuse data FDATA as repair information INF_R and output the repair information INF_R to the repair control circuit 240. The repair control circuit 240 may compare the repair information INF_R provided from the latch circuit 230 with the column address COL_ADD inputted from an exterior, and output the repair control signal RCS, thereby allowing the repair operation to be performed.

Although various embodiments have been described for illustrative purposes, it will be apparent to those skilled in the art that various changes and modifications may be made without departing from the spirit and scope of the invention as defined in the following claims.

What is claimed is:

1. A nonvolatile storage circuit comprising:
    a nonvolatile storage unit configured to include fuse set groups respectively including a plurality of fuse sets and a flag fuse;
    a rupture control unit configured to program an input address to the fuse sets in a first program mode, and to program a same input address to a specific fuse set among the plurality of fuse sets in a specific fuse set group among the fuse set groups and to program the flag fuse of the specific fuse set group in a second program mode; and
    a boot-up control unit configured to control the address programmed in the fuse sets to be outputted as fuse data, and to control the address programmed in the specific fuse set to be outputted as fuse data of remaining fuse sets among the plurality of fuse sets in the specific fuse set group.

2. The nonvolatile storage circuit of claim 1, wherein the number of fuse sets included in one fuse set group is decided according to the number of times by which the same input address is continuously inputted in the second program mode.

3. The nonvolatile storage circuit of claim 1, wherein the specific fuse set is a first fuse set of each fuse set group.

4. The nonvolatile storage circuit of claim 1, wherein each of the fuse sets comprises:
    physical location information; and
    repair address information.

5. The nonvolatile storage circuit of claim 4, wherein the physical location information comprises:
    information indicating a fuse set group that a corresponding fuse set belongs to; and
    fuse set information indicating a sequence of the corresponding fuse set in the indicated fuse set group.

6. The nonvolatile storage circuit of claim 1, wherein the nonvolatile storage unit includes an e-fuse array.

7. A semiconductor memory device comprising:
    a memory array area configured to include a normal cell area including normal cells and a redundancy cell area including redundancy cells to be replaced with repair target cells of the normal cells;
    a nonvolatile storage unit configured to include fuse set groups respectively including a plurality of fuse sets and a flag fuse;
    a rupture control unit configured to program a repair address of the repair target cells to the fuse sets in a rupture mode, and to program the repair address to a specific fuse set among the plurality of fuse sets in a specific fuse set group among the fuse set groups and to program a flag fuse of the specific fuse set group in an iterative program mode;
    a boot-up control unit configured to output the repair address programmed in the fuse sets as fuse data, and to control the repair address programmed in the specific fuse set to be outputted as fuse data of remaining fuse sets among the plurality of fuse sets in the specific fuse set group, in a boot-up mode;
    a latch circuit configured to store the fuse data; and
    a repair control circuit configured to control a repair operation of the repair target cells and the redundancy cells to be performed using the fuse data stored in the latch circuit.

8. The semiconductor memory device of claim 7, wherein the iterative program mode includes a mode in which substantially a same repair address is repeatedly programmed a predetermined number of times.

9. The semiconductor memory device of claim 7, wherein the iterative program mode includes a program mode in which both an on-chip error correction code (ECC) mode allowing an error correction code (ECC) function to be provided in the semiconductor memory device and the rupture mode are performed.

10. The semiconductor memory device of claim 7, wherein a part of the normal cell area includes a parity area for storing an error correction code (ECC) parity bit.

11. The semiconductor memory device of claim 10, wherein the normal cell area includes a plurality of sub-sections defined by a plurality of row sections and a plurality of column sections, and
    the number of fuse sets included in one fuse set group corresponds to the number of the column sections.

12. The semiconductor memory device of claim 11, wherein the parity area is assigned to one of the plurality of sub-sections.

13. The semiconductor memory device of claim 7, wherein the repair address includes a column address.

14. The semiconductor memory device of claim 7, wherein the specific fuse set is a first fuse set of each fuse set group.

15. The semiconductor memory device of claim 7, wherein each of the fuse sets comprises:
    physical location information; and
    repair address information.

16. The semiconductor memory device of claim 15, wherein the physical location information comprises:
    information indicating a fuse set group that a corresponding fuse set belongs to; and
    fuse set information indicating a sequence of the corresponding fuse set in the indicated fuse set group.

17. The semiconductor memory device of claim 7, wherein the nonvolatile storage unit includes an e-fuse array.

18. An operating method of a nonvolatile storage circuit, comprising:
    providing a plurality of fuse set groups respectively including a plurality of fuse sets and a flag fuse, in the nonvolatile storage circuit;
    programming an input address to the fuse sets in a first program mode, and programming a same input address to a specific fuse set among the plurality of fuse sets in a specific fuse set group among the fuse set groups and programming the flag fuse of the specific fuse set group in a second program mode; and
    outputting the address programmed in the fuse sets as fuse data, and outputting the address programmed in the specific fuse set as fuse data of remaining fuse sets among the plurality of fuse sets in the specific fuse set group.

19. The operating method of claim 18, wherein the number of fuse sets included in one fuse set group is decided according to a number of times by which the same input address is continuously inputted in the second program mode.

20. The operating method of claim 18, wherein the nonvolatile storage circuit includes an e-fuse array.

\* \* \* \* \*